US012724598B2

(12) United States Patent
Dubrovsky et al.

(10) Patent No.: US 12,724,598 B2
(45) Date of Patent: Sep. 1, 2026

(54) PREDICTION OF ENVIRONMENTAL BEHAVIOR AND AUTOMATIC ADJUSTMENT OF NETWORK POLICY GENERATION FOR EDGE INFRASTRUCTURE

(71) Applicant: Dell Products L.P., Round Rock, TX (US)

(72) Inventors: Igor Dubrovsky, Beer Sheva (IL); Boris Shpilyuck, Ashdod (IL); Maxim Balin, Gan-Yavne (IL)

(73) Assignee: Dell Products L.P., Round Rock, TX (US)

( * ) Notice: Subject to any disclaimer, the term of this patent is extended or adjusted under 35 U.S.C. 154(b) by 315 days.

(21) Appl. No.: 18/471,605

(22) Filed: Sep. 21, 2023

(65) Prior Publication Data

US 2025/0103315 A1 Mar. 27, 2025

(51) Int. Cl.

| | |
|---|---|
| ***G06F 9/445*** | (2018.01) |
| ***G06F 8/65*** | (2018.01) |
| ***G06F 30/20*** | (2020.01) |

(52) U.S. Cl.

CPC ................ *G06F 8/65* (2013.01); *G06F 30/20* (2020.01)

(58) Field of Classification Search

CPC . G06F 3/067; G06F 8/65; G06F 16/23; G06F 2212/1016; G06F 8/71; G06F 30/20; G06F 3/0649

See application file for complete search history.

(56) References Cited

U.S. PATENT DOCUMENTS

| | | | | |
|---|---|---|---|---|
| 2022/0334725 | A1* | 10/2022 | Mertes | G06F 3/065 |
| 2022/0391124 | A1* | 12/2022 | Darji | G06F 3/0679 |

* cited by examiner

*Primary Examiner* — Chuck O Kendall

(74) *Attorney, Agent, or Firm* — WOMBLE BOND DICKINSON (US) LLP

(57) ABSTRACT

Methods and systems for managing operation of endpoint devices are disclosed. The operation of the endpoint devices may be managed by restricting the communication capabilities of the endpoint devices. For services that are to be provided by the endpoint devices, some communication capabilities may be selectively enabled. The selective enablement of the communication capabilities may be evaluated prior to implementation through simulation using a digital twin. The selective enablement may only be implemented if it meets criteria.

20 Claims, 5 Drawing Sheets

PREDICTION OF ENVIRONMENTAL BEHAVIOR AND AUTOMATIC ADJUSTMENT OF NETWORK POLICY GENERATION FOR EDGE INFRASTRUCTURE

FIELD

Embodiments disclosed herein relate generally to device management. More particularly, embodiments disclosed herein relate to systems and methods to secure devices.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components and the components of other devices may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
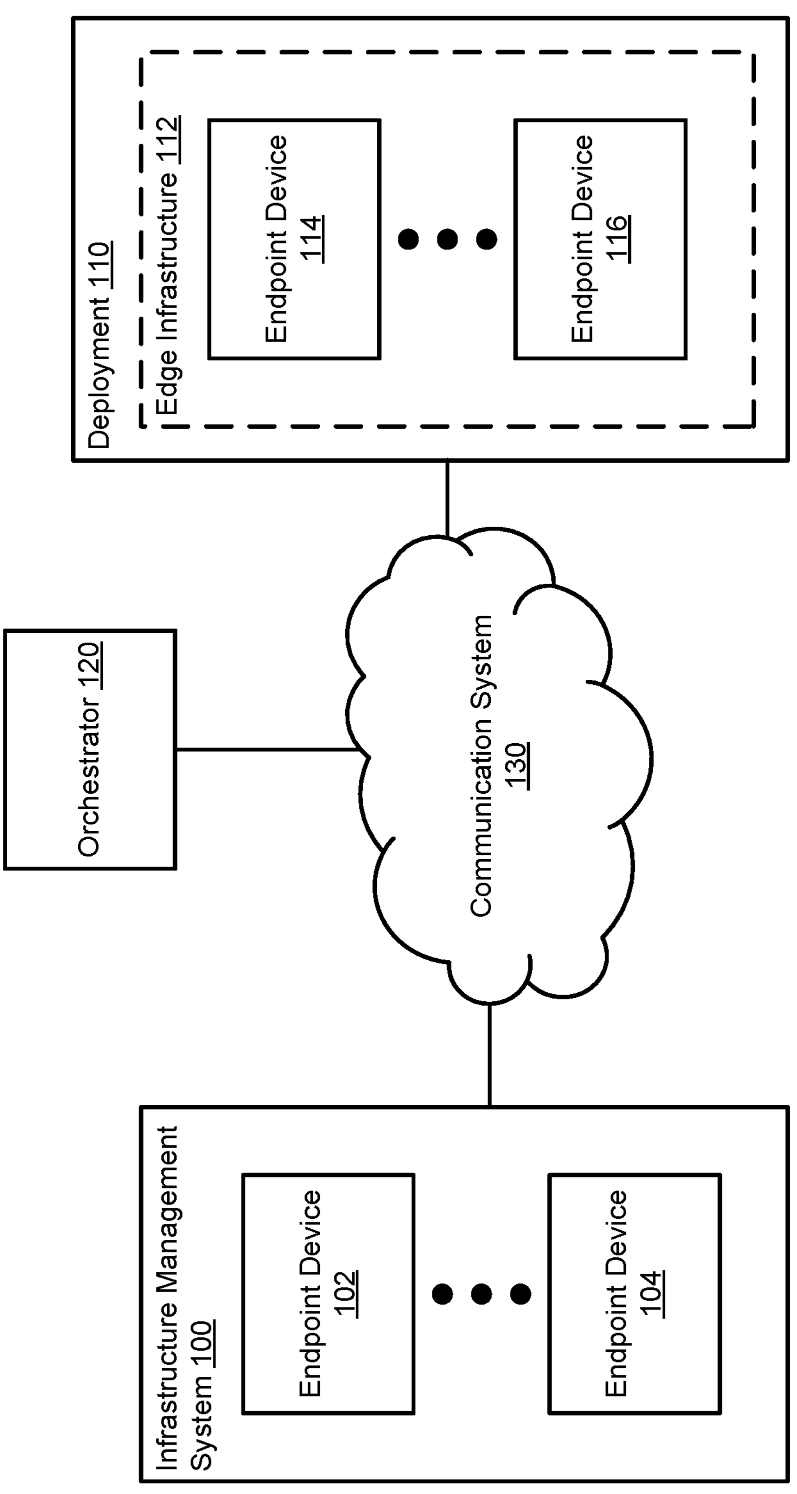
FIG. 1A shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing services using endpoint devices. To provide services using endpoint devices, the endpoint devices may host various pieces of software, may be configured in certain manners, and/or may be adapted to provide the computer implemented services in various ways.

During operation, the services may utilize ports, communication protocols, services hosted by other network devices, and/or may otherwise depend on the ability to communicate with other devices (e.g., network dependencies). However, to reduce the susceptibility of endpoint devices to compromise, the communication capabilities of the endpoint devices may be generally restricted.

When a new services is to be deployed, the source code for the service may be analyzed to identify its network dependencies. The network dependencies may be used to establish a network policy that when implemented by edge infrastructure allows the service to operate by, for example, opening ports, enabling communication protocols, etc.

However, prior to implementation of the network policy, the network policy may be evaluated through simulated operation of the edge infrastructure under the network policy using a digital twin. The simulation may be used to evaluate impact of the network policy on the edge infrastructure.

If the impact is acceptable, then the network policy and instances of the service may be deployed. If the impact is unacceptable, then the network policy may be updated and/or replaced and re-evaluated through simulation. This process may be repeated until a network policy with acceptable impact is identified.

By doing so, embodiments disclosed herein may facilitate deployment of new services with corresponding network policies that are less likely to have undesired impacts on edge infrastructure Thus, embodiments disclosed herein may address, among others, the technical problem of security in a distributed system. By restricting network function and only enabling network function selectively, endpoint devices may be less likely to be compromised while enable desired services to be provided.

In an embodiment, a method for managing operation of endpoint devices of edge infrastructure is provided. The method may include obtaining source code for a service for deployment to the edge infrastructure; identifying, based on the source code, network dependencies for the service; generating, based on the network dependencies and operation goals for the edge infrastructure, at least one network policy to facilitate operation of the service in the edge infrastructure; monitoring operating of a digital twin of the edge infrastructure while the at least one network policy is enforced to obtain at least one metric; scoring the at least one network policy using the at least one metric and the operation goals to identify a highest rated network policy; deploying the highest rated network policy and the service to the edge infrastructure to obtain updated edge infrastructure; and providing the service using the updated edge infrastructure.

The at least one metric may quantify an impact of the at least one network policy on operation of the digital twin, the digital twin may simulate operation of the deployment while that least one network policy is not enforced, and the digital twin may predict operation of the deployment under the at least one network policy while the at least one network policy is enforced in the digital twin.

The method may also include adding, to the digital twin, a first simulation component corresponding to the service; adding, to the digital twin, a second simulation component corresponding to at portion of the at least one network policy; and operating the digital twin with the first simulation component and the second simulation component.

Prior to addition of the first simulation component and the second simulation component, the digital twin may simulate operation of the edge infrastructure.

The operation goals may specify a security standard for the edge infrastructure. The security standard may discriminate acceptable security risks presented by the service when hosted by the edge infrastructure from unacceptable security risks presented by the service when hosted by the edge infrastructure.

The operation goals may also specify a performance standard for the edge infrastructure. The performance standard may discriminate acceptable levels of performance of the service by the edge infrastructure from unacceptable levels of performance of the service by the edge infrastructure. The performance and security standards may be implemented using thresholds or other criteria tied to metric values. The operation goals may also include serviceability standards. The serviceability standards may indicate required abilities to remotely service the edge infrastructure. For example, the serviceability standards may require that remote access and remote management for the edge infrastructure be available.

The network dependencies may specify other services hosted by the infrastructure on which operation of the service depends.

The network dependencies may also specify protocols implemented by the edge infrastructure on which the operation of the service depends.

The network dependencies may further specify ports of endpoint devices of the edge infrastructure on which the operation of the service depends.

In an embodiment, a non-transitory media is provided. The non-transitory media may include instructions that when executed by a processor cause the computer-implemented method to be performed.

In an embodiment, a data processing system is provided. The data processing system may include the non-transitory media and a processor, and may initiate performance the computer-implemented method when the computer instructions are executed by the processor.

Turning to FIG. 1A, a block diagram illustrating a system in accordance with an embodiment is shown. The system shown in FIG. 1A may provide computer-implemented services. The computer implemented services may include any type and quantity of computer implemented services. For example, the computer implemented services may include data storage services, instant messaging services, database services, transaction processing services, and/or any other type of service that may be implemented with a computing device.

To provide the computer implemented services, the system may include deployment 110. Deployment 110 may edge infrastructure 112 which may include any number of endpoint devices (e.g., 114, 116). The endpoint devices may cooperatively and/or individually provide all, or a portion of the computer implemented services.

To contribute to the computer implemented services, the endpoint devices may host certain software, may be configured in certain manners (e.g., network communication configurations, software/hardware configurations, etc.), and/or may otherwise be modified to meet one or more requirements to contribute to the computer implemented services. Further, groups of endpoint devices may be modified to cooperatively provide various services. For example, some endpoint devices of a group may host some software to provide some functions while other endpoint devices of a group may host different software to provide other functions which, in aggregate, allow desired computer implemented services to be provided.

However, due to the placement of endpoint devices (e.g., at an edge installation) and the resources of the endpoint devices, the endpoint devices may be more susceptible to malicious activity. For example, any of the endpoint devices may be part of an edge installation (e.g., 112) which may subject the endpoint devices to physical attacks (e.g., malicious devices may be operably connected to the endpoint devices by attaching the malicious device to a port of a network interconnecting the endpoint devices), network attacks (e.g., networks that support operation of the edge installation may include fewer security mechanisms than would be present in other computing environments such as data centers), and/or the endpoint device may be subject to more vectors of attack for other reason when compared to computing devices located in other computing environments.

In general, embodiments disclosed herein may provide methods, systems, and/or devices for managing the operation of edge infrastructure. To manage the edge infrastructure, a security framework for edge devices of the edge infrastructure may be enforced. The security framework may limit network communications between endpoint devices. The limits on communication may be defined by network policies. Implementation of the network policies may reduce the likelihood of the endpoint devices being compromised (e.g., by reducing the likelihood of the endpoint devices receiving and processing malicious communications intended to result in compromise of the endpoint device, data maintained by the endpoint devices, etc.).

However, implementation of network policies that limit communications may have undesired impacts on the ability of services to be provided by edge infrastructure. For example, any of the services may have dependence on the ability of an endpoint device to communicate with other endpoint devices in certain manners. Consequently, network policies may limit or prevent services from being provided.

To manage the impact of network policies on services provided by edge infrastructure, the impact of network policies on edge infrastructure may be evaluated prior to implementation of the network policies by the edge infrastructure. The network policies may be evaluated by simulating the operation of edge infrastructure under the network policies using a digital twin of edge infrastructure 112.

The digital twin may attempt to simulate operation of the edge infrastructure. For example, the digital twin may include simulation components corresponding to different components of the edge infrastructure. Additionally, telemetry information from the components of the edge infrastructure may be used to conform the operation of these simulation components to real world operation of the edge infrastructure.

To simulate the operation of edge infrastructure while new network policies are enforced, existing simulation components may be updated and/or new simulation components may be established. These new/updated simulation components may simulate the operation of endpoint devices that implement the new network policies.

The impact of the new network policies on the operation of the edge infrastructure may be predicted based on the simulation. For example, the impact may be identified by collecting various metrics quantifying aspects of the operation of the simulated edge infrastructure under influence of the new network policies. The metrics may be compared to corresponding metrics from simulations of the edge infrastructure without the influence of the new network policies. The metrics may quantify, for example, performance of various services hosted by the edge infrastructure, the susceptibility of components of the edge infrastructure to compromise, the ease of manage components of the edge infrastructure, and/or other aspects of the operation of edge infrastructure 112.

Any number of network policies may be evaluated until a policy that meets goals or other criteria is identified. The identified network policy may be deployed along with corresponding services to edge infrastructure 112.

By doing so, embodiments disclosed herein may provide a system that is more likely to provide desired computer implemented services through identification and deployment of network policies that balance risk of compromise against performance penalties for implementation of various network policies.

To provide the above noted functionality, the system of FIG. 1A may include infrastructure management system 100, deployment 110, orchestrator 120, and communication system 130. Each of these components is discussed below.

Infrastructure management system 100 may facilitate management of deployment 110. Infrastructure management system 100 may include any number of endpoint devices (e.g., 102, 104). The endpoint devices may be used by administrators and/or other persons that manage deployment 110 to provide desired computer implemented services.

Figure 2:
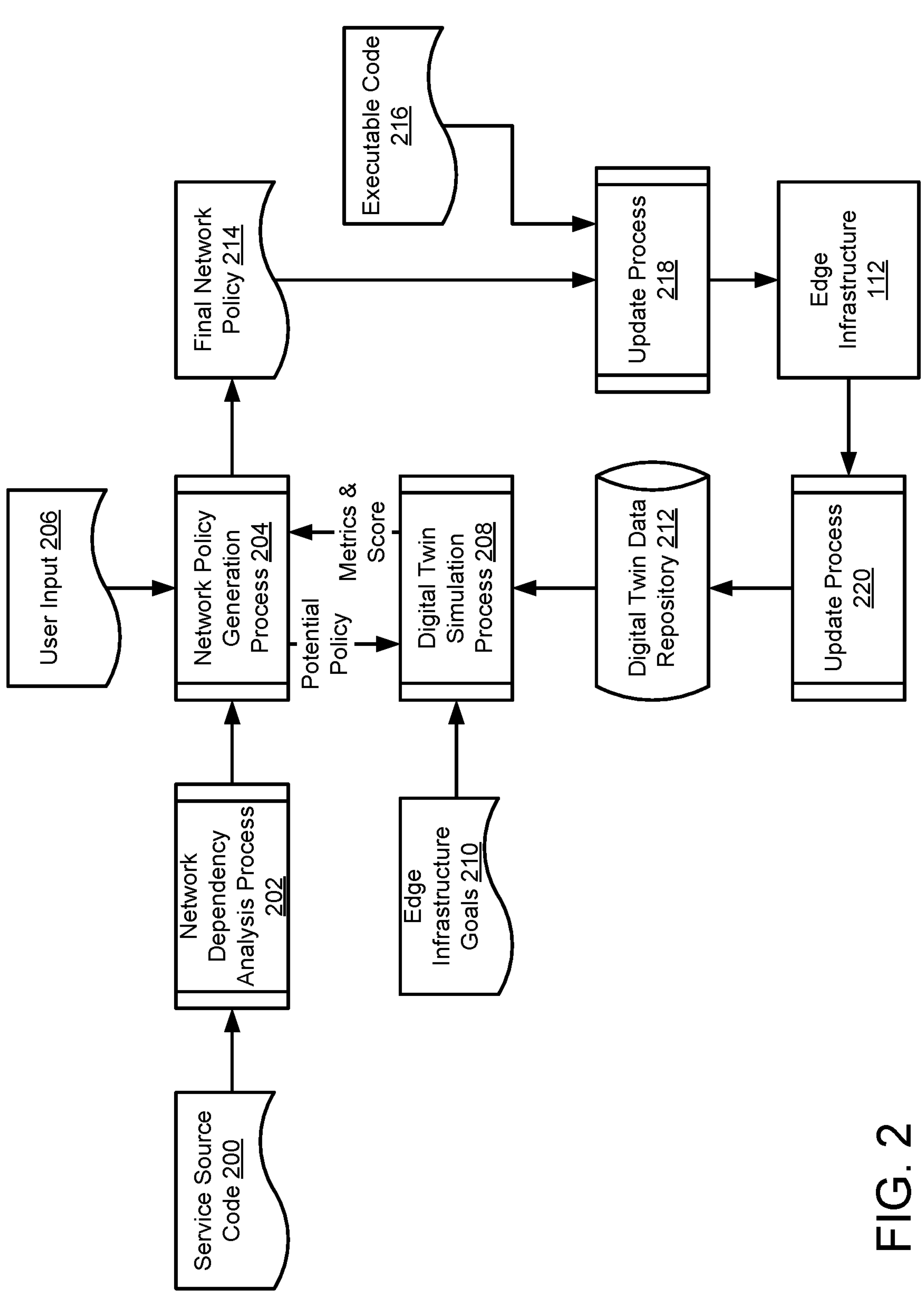
FIG. 2 show a data flow diagram in accordance with an embodiment.

To manage deployment 110, the endpoint devices (e.g., 102-104) may be used to identify and evaluate network policies for services to be provided by edge infrastructure 112. Any of the endpoint devices may host digital twin models of edge infrastructure 112, and/or components thereof, to evaluate the impact of deployment of network policies and/or services to edge infrastructure 112. Refer to FIG. 2 for additional details regarding evaluation of network policies.

Orchestrator 120 may manage deployment 110. To manage deployment 110, orchestrator 120 may present interfaces to users of data processing systems 102-104 of infrastructure management system 100. The interfaces may allow privileged users (e.g., administrators, etc.) to enforce security frameworks by, for example, deploying network policies and services to endpoint devices 114-116. Additionally, orchestrator 120 may collect telemetry data from edge infrastructure 112, and provide the telemetry data to infrastructure management system 100. The telemetry data may be used to update digital twin models of edge infrastructure 112.

Deployment 110, as noted above, may provide computer implemented services. To provide the computer implemented services, the endpoint devices of deployment 110 may host various services (e.g., which may be implemented using instances of microservices).

Figure 1B:
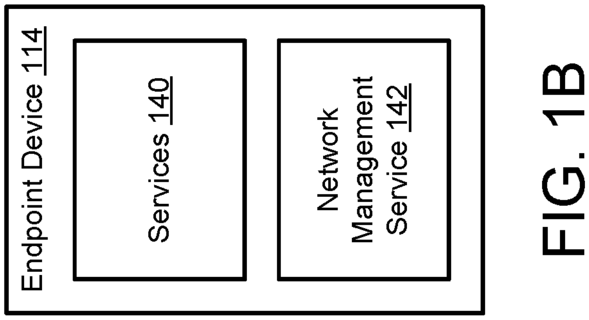
FIG. 1B shows a block diagram illustrating an endpoint device in accordance with an embodiment.

To manage the security of edge infrastructure 112, endpoint devices 114-116 may implement network policies. The network policies may be deployed by orchestrator 120. The network policies may, for example, specify limits on how each endpoint device may communicate with other devices. For example, the network policies may specify port closures from network traffic, traffic screening to be performed, connectivity limits to be enforced, and/or other types of requirements regarding how each endpoint device communicates with other devices. Refer to FIG. 1B for additional details regarding endpoint devices 114-116.

Figure 3:
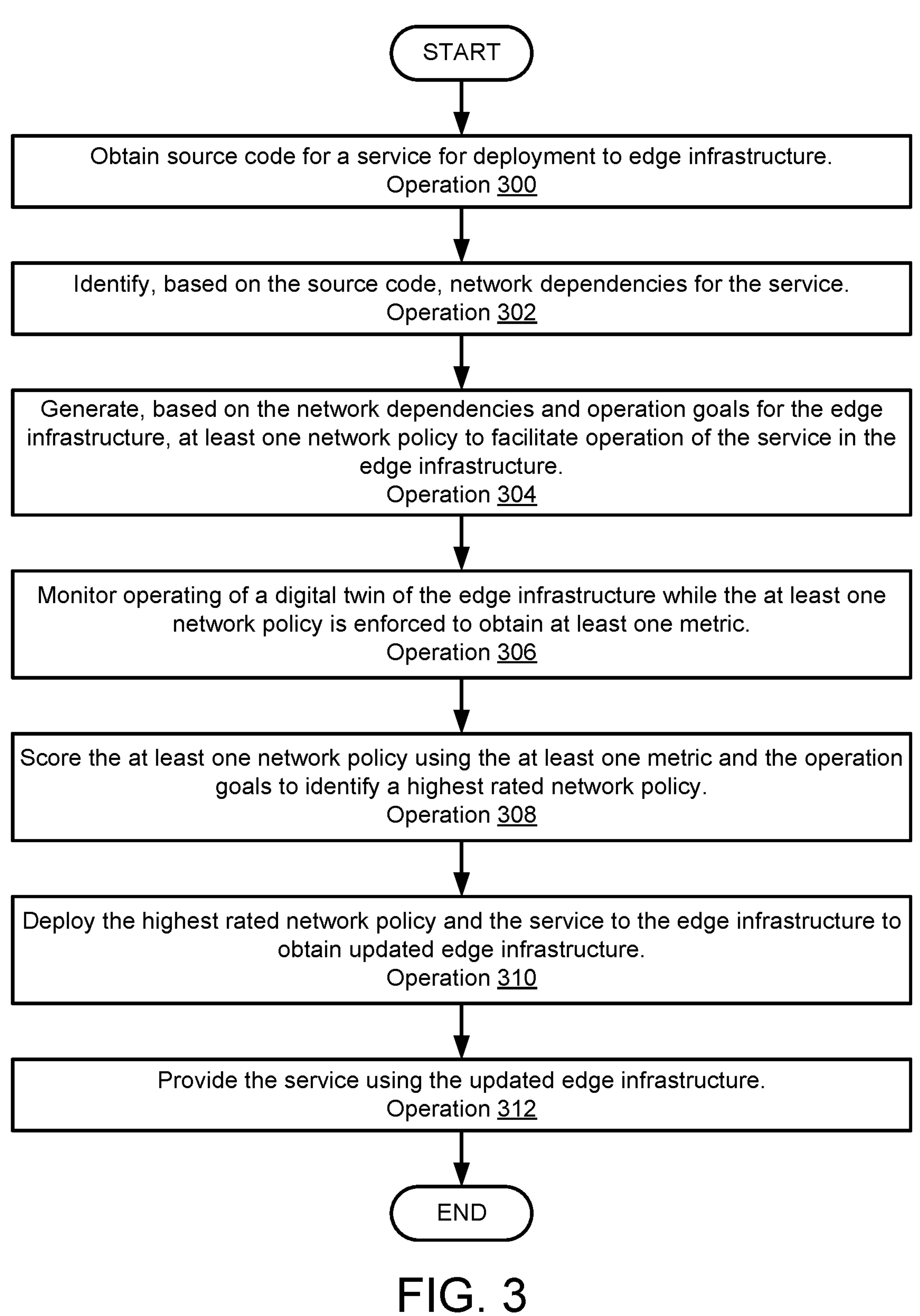
FIG. 3 shows a flow diagram illustrating a method in accordance with an embodiment.

When providing their functionality, any of (and/or components thereof) infrastructure management system 100, deployment 110, and/or orchestrator 120 may perform all, or a portion, of the actions and methods illustrated in FIGS. 2-3.

Any of (and/or components thereof) infrastructure management system 100, deployment 110, and orchestrator 120 may be implemented using a computing device (also referred to as a data processing system) such as a host or a server, a personal computer (e.g., desktops, laptops, and tablets), a "thin" client, a personal digital assistant (PDA), a Web enabled appliance, a mobile phone (e.g., Smartphone), an embedded system, local controllers, an edge node, and/or any other type of data processing device or system. For additional details regarding computing devices, refer to FIG. 4.

Any of the components illustrated in FIG. 1A may be operably connected to each other (and/or components not illustrated) with communication system 130. In an embodiment, communication system 130 includes one or more networks that facilitate communication between any number of components. The networks may include wired networks and/or wireless networks (e.g., and/or the Internet). The networks may operate in accordance with any number and types of communication protocols (e.g., such as the internet protocol).

While illustrated in FIG. 1A as including a limited number of specific components, a system in accordance with an embodiment may include fewer, additional, and/or different components than those illustrated therein.

Turning to FIG. 1B, a block diagram of endpoint device 114 in accordance with an embodiment is shown. Infrastructure 112 may include any number of endpoint devices similar to endpoint device 114.

Endpoint device 114 may host any number of services 140 and network management service. Services 140 may correspond to any number of instances of executing computer code for various applications. Services 140 may provide any number and type of computer implemented services in isolation and/or in combination with services hosted by other endpoint devices.

The operation of any of services 140 may depend on access to other services hosted by endpoint device 114 and/or other services hosted by other devices. To access other services hosted by other endpoint devices 114, any of services 140 may send network communications to other endpoint devices. If services 140 are unable to communicate with the other services, then services 140 may be unable to operate nominally. For example, if a services hosted by endpoint device 114 is dependent on access to a database services hosted by another endpoint device for data used in operation of the service, then the service may stop functioning if the database service is unable to be accessed (e.g., thereby depriving the service of access to data necessary for its operation). Thus, the nominal operation any of services 140 may depend on network access to other endpoint devices.

Network management service 142 may enforce network policies distributed by orchestrator 120. Network management service 142 may enforce the network policies, for example, by (i) modifying operation of communication ports of endpoint device 114, (ii) establishing network communication screening protocols for received communications, and/or performing other actions to conform the network connectivity of endpoint device 114 to that specified the network policies.

The network policies obtained from orchestrator 120 may include (i) network policies associated with some of services 140, and (ii) other network policies. The network policies associated with some of services 140 may specify, for example, network communication requirements for corresponding services (e.g., certain ports being opened, certain communications between whitelisted, etc.).

The other network policies may not be associated with any of services 140, but may specify network communication limits to be implemented by endpoint device 114 for security purposes. These other network policies may, for example, specify port ranges that are opened or closed, network communication screening procedures, and/or other types of activities to be performed to limit the network connectivity of endpoint device 114.

Thus, if a network policies is deployed to endpoint device 114 that unduly limits the network connectivity of endpoint device 114, one or more of services 140 may be undesirably impacted. For example, a network policy that unduly limits the network connectivity of endpoint device 114 may (i) increase latency for access to other services, (ii) prevent access to other services, and/or otherwise may result in desired outcomes.

To further clarify embodiments disclosed herein, a data flow diagram in accordance with an embodiment is shown in FIG. 2. In the diagram, flows of data and processing of data are illustrated using different sets of shapes. A first set of shapes (e.g., 200, 206, etc.) is used to represent data structures, a second set of shapes (e.g., 202, 204, etc.) is used to represent processes performed using and/or that generate data, and a third set of shapes (e.g., 212, etc.) is used to represent large scale data structures such as databases.

Turning to FIG. 2, a data flow diagram in accordance with an embodiment is shown. The data flow diagram may illustrate data used in and data processing performed in network policy deployment to edge infrastructure 112.

To deploy network policies, service source code 200 for a service may be obtained. Service source code 200 may correspond to a service that is to be deployed to edge infrastructure. The service source code 200 may include the uncompiled source code for the service.

Once obtained, service source code 200 may be ingested by network dependency analysis process 202. During network dependency analysis process 202, network dependencies of the services may be identified. The network dependencies may be network connectivity requirements of the service to operate. For example, the network dependencies may include ports of a host endpoint device that need to be open, types of traffic that may need to be able to be sent/received, communication protocols that must be available and/or used by a host endpoint device, other services on which the service depends, and/or other dependencies of the service on the network environment in which a host endpoint device resides.

To identify the network dependencies, service source code 200 may be syntactically analyzed. For example, service source code 200 may be analyzed using rules (e.g., code matching), analyzed using a large language model that infers network dependencies based on syntax, and/or via other methods.

Once obtained, the network dependencies may be ingested by network policy generation process 204. During network policy generation process 204, final network policy 214 may be generated. To generate final network policy 214, prototype network policies may be generated and evaluated by digital twin simulation process 208. Any number of prototype network policies may be generated and evaluated to obtain final network policy 214.

The prototype network policies may be generated based on the network dependencies obtained from network dependency analysis process 202 and/or using user input 206. An initial prototype network policy may be generated that ensures all of the network dependencies are met (e.g., certain ports are open, etc.). The initial policy may be ingested by digital twin simulation process 208.

During digital twin simulation process 208, a simulation of edge infrastructure 112 may be performed under the influence of the initial prototype network policy. For example, simulation components corresponding to the initial prototype network policy may be added to other simulation components corresponding to edge infrastructure 112 (and/or existing simulation components may be updated). The resulting simulation may simulate the operation of edge infrastructure 112 with the initial prototype network policy being implemented by one or more endpoint devices of edge infrastructure 112.

Additionally, while not shown, an administrator or other person may specify where new instances of a service based on service source code 200 are to be added to the simulation. Simulation components for the initial prototype network policy and the new instances of the service may be added to the digital twin model to simulate behavior of edge infrastructure 112 should be new services and policies be deployed to it.

The operation of the simulated edge infrastructure may be monitored to obtain metrics for comparison. The metrics may indicate (i) rates at which various simulated services of edge infrastructure 112 will operate under the initial prototype network policy, (ii) vulnerabilities of edge infrastructure 112 under the initial prototype network policy, (iii) serviceability of edge infrastructure 112 under the initial prototype network policy, and/or other aspects of operation of edge infrastructure 112 under the initial prototype network policy.

These metrics may be evaluated based on edge infrastructure goals 210. Edge infrastructure goals 210 may define a scoring system for the simulated operation of edge infrastructure 112 under the initial prototype network policy. The scoring system may be customized to desired goals of administrators or other persons tasked with managing operation of edge infrastructure 112. The resulting metrics and score may be returned to network policy generation process 204.

Once obtained, the metrics and/or score may be compared to evaluation criteria (e.g., a score threshold) and/or provided to an administrator or other person for review. Based on the automated comparison and/or manual review, the initial prototype network policy may either be approved (e.g., thereby becoming final network policy 214) or revised based on additional user input.

For example, an administrator may modify the initial prototype network policy. If modified, the modified network policy may be provided to digital twin simulation process 208 for evaluation. The aforementioned process may be repeated until final network policy 214 is obtained.

To ensure that digital twin simulation process 208 accurately represents the operation of edge infrastructure 112, information from digital twin data repository 212 may be used in the simulation. Digital twin data repository 212 may include up to date information regarding edge infrastructure 112.

For example, when changes to the operation and/or components of edge infrastructure 112 are made, update process 220 may track the changes and update digital twin data repository 212 based on the changes. Additionally, telemetry data from edge infrastructure 112 may be streamed to digital twin data repository 212 via update process 220 (e.g., agents on each endpoint device of edge infrastructure 112 may report telemetry data over time). The telemetry data may include, for example, measurements regarding the condition of hardware components of edge infrastructure 112, information regarding operation of the components of edge infrastructure 112 including, for example, errors or unexpected operation, and/or other types of information regarding the operation of edge infrastructure 112. Consequently, digital twin simulation process 208 may be likely to accurately simulate the operation of edge infrastructure 112 (e.g., with or without applied network policies).

Once final network policy 214 is obtained, update process 218 may be performed. During update process 218, final network policy 214 and/or executable code 216 may be deployed to edge infrastructure 112. Executable code 216 may the executable version (e.g., compiled version) of service source code.

Final network policy 214 and executable code 216 may be deployed using an automation framework. The automation framework may transmit copies of final network policy 214 and/or executable code 216 to endpoint devices of edge infrastructure 112 that are to implement final network policy 214 and/or executable code 216 (e.g., may be based on the simulation that indicated that the network policy is acceptable, refer to the discussion of digital twin simulation process 208). For example, the list of entities to which service source code 200 is to be deployed may also receive copies of final network policy 214 as well.

When received, new service instances may be implemented using executable code 216. Additionally, the received copies of final network policy 214 may begin to be enforced by the network management service hosted by each endpoint device.

Once the final network policy and new service instances are in place, edge infrastructure 112 may begin to provide additional services. Consequently, the capabilities of edge infrastructure 112 may be expanded.

Thus, using the flow shown in FIG. 2, a system in accordance with an embodiment may be less likely to provide computer implemented services that are negatively impacted by network policies. By simulating the impact of the network policies on the performance of the processes hosted by endpoint devices, network policies may be accurately assessed for impact prior to use in edge infrastructure. Accordingly, once the network policies are deployed, the policies may be more likely to balance security concern against performance impact.

As discussed above, the components of FIG. 1A may perform various methods to manage operation of endpoint devices by reducing the likelihood of network policies negatively impacting operation of services hosted by the endpoint devices. FIG. 3 illustrates a method that may be performed by the components of the system of FIG. 1A. In the diagram discussed below and shown in FIG. 3, any of the operations may be repeated, performed in different orders, and/or performed in parallel with or in a partially overlapping in time manner with other operations.

Turning to FIG. 3, a flowchart illustrating a method of managing the operation of endpoint devices in accordance with an embodiment is shown. Any of the component shown in FIG. 1A may perform all, or a portion, of the method shown in FIG. 3.

At operation 300, source code for a service for deployment to edge infrastructure is obtained. The source code may be obtained by (i) reading the source code from storage, (ii) obtaining the source code from another device, (iii) generating the source code based on user input, and/or via other methods.

In an embodiment, the source code is obtained in response to an administrator indicating that at least one new instance of a service is to be deployed to the edge infrastructure. The administrator (or other person) may do so using a management portal of an orchestrator tasked with managing endpoint devices of the edge infrastructure. An identifier of the service may be used to obtain the source code from a repository or other source.

At operation 302, network dependencies for the service are identified based on the source code. The network dependencies may be obtained by syntactically analyzing the source code. The syntactic analysis may be performed using a set of rules, a model (e.g., a large language model), and/or via other methods. The syntactic analysis may identify (i) other services on which the service is dependent, (ii) communication protocols used by the service, (iii) ports used by the service, and/or (iv) other information regarding requirements for a network environment in which the service will reside for the service to operate nominally.

For example, the syntactic analysis may look for references to network ports, invocations of communication libraries, invocations of other services, and/or other indicators of reliance on the existence of other entities and/or network environment conditions.

At operation 304, at least one network policy is generated to facilitate operation of the service in the edge infrastructure. The at least one network policy may be based on network dependencies and operation goals for the edge infrastructure.

For example, prototype network policies may be sequentially generated and then evaluated as described with respect to operations 306-308 below. Each network policy may be scored based on the impact that it is likely to have on operation of the edge infrastructure. This process may be repeated until a certain number of policies have been evaluated and/or a policy meeting the operation goals for the edge infrastructure is identified.

The operation goals may specify how scores for network policies are calculated. For example, the scoring system may take into the performance impact on services of the edge infrastructure, the serviceability of the edge infrastructure, and the security posture (e.g., likelihood of being compromised) under a given network policy. The operation goals may take into account other factors. Each factor may be based on corresponding metrics from a simulation of operation of the infrastructure under the network policy (and/or new instances of the service). For example, the scoring system may be a weighted sum of the factors, with different weights for the factors being adjustable by an administrator or other person to selectively weight network policies towards different outcomes (e.g., higher performance, higher security, easier serviceability, etc.).

Each network policy may specify, for example, the protocols, ports, other services, and/or other aspects of the edge infrastructure that are to be present/available. When deployed, the endpoint devices may resolve conflicts in favor of the policies generated for the services rather than for general network policies in place for default security (e.g., default policies may generally restrict network communications, while the network policies established for corresponding services may whitelist or otherwise indicate that certain functionalities such as ports or communication protocols are to be enabled thereby overriding default off policies of the general network policies).

At operation 306, operation of a digital twin of the edge infrastructure is monitored while the at least one network policy is enforced to obtain at least one metric. The operation may be monitored by (i) instantiating simulation components corresponding to at least some of the at least one network policy, (ii) initiating simulation of the digital twin with the instantiated simulation components to simulate operation of the edge infrastructure with the network policies in place, and (iii) reading data from the simulation that corresponds to the at least one metric. The at least one metric may include, for example, performance of various services simulated by the digital twin, susceptibility of endpoint devices to compromise from various vectors (e.g., the network state of each endpoint device may be evaluated with respect to different attack vectors that depend on aspects of the network state such as open ports, use of communication protocols, etc.), maintainability of the endpoint devices which may depend on aspect of the network state of the endpoint devices, and/or other characteristics of the edge infrastructure. The obtained at least one metric may quantify characteristics of operation of the edge infrastructure under the at least one network policy.

At operation 308, the at least one network policy is scored using the at least one metric and the operation goals to identify a highest rated network policy. As discussed above, multiple network policies may be generated, simulated, and monitored to obtain corresponding metrics. The metrics corresponding to each network policy may be scored using the operation goals (e.g., a scoring system) to obtain numerical quantifications reflecting the fitness of each of the network policies. The network policies may be ranked ordered based on each policy's fitness to identify the highest rated network policy (e.g., the best ranked network policy).

At operation 310, the highest rated network policy and the service is deployed to the edge infrastructure to obtain updated edge infrastructure. The highest rated network policy and the service may be deployed by instructing an orchestrator to do so. The orchestrator may invoke an automation framework to distribute copies of the highest rated network policies to some endpoint devices (which may begin enforcement automatically) and instantiate instance of the service in the endpoint devices.

At operation 312, the service is provided using the updated edge infrastructure. The service may be provided by initiating operation of the instances of the service and enforcement of the copies of the network policies by corresponding endpoint devices.

The method may end following operation 312.

Thus, using the method illustrated in FIG. 3, a system in accordance with embodiments disclosed herein may sequentially generate and evaluate network policies for services prior to implementation of any of the network policies until a network policy that is sufficient fit is obtained. The fitness of network policies may be identified and compared to thresholds or other criteria until a sufficiently fit network policy is identified.

Figure 4:
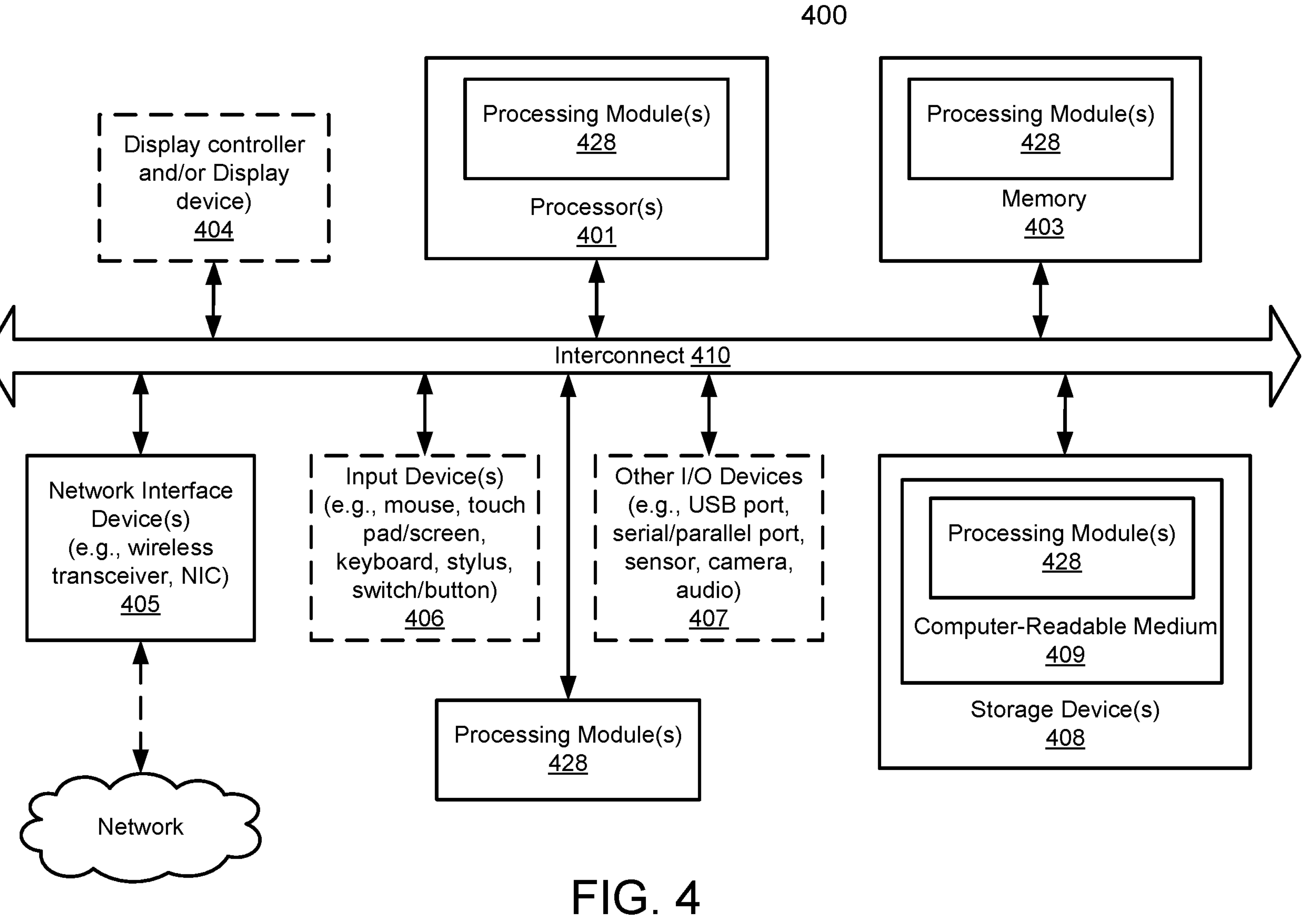
FIG. 4 shows a block diagram illustrating a data processing system in accordance with an embodiment.

Any of the components illustrated in FIGS. 1A-2 may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A method for managing operation of endpoint devices of edge infrastructure, the method comprising:

obtaining source code for a service for deployment to the edge infrastructure;

identifying, based on the source code, network dependencies for the service;

generating, based on the network dependencies and operation goals for the edge infrastructure, at least one network policy to facilitate operation of the service in the edge infrastructure, wherein the operation goals specify a security standard for the edge infrastructure, and the network policy defines a limit on network communications between the endpoint devices of the edge infrastructure to discriminate acceptable security risks from unacceptable security risks;

monitoring operating of a digital twin of the edge infrastructure while the at least one network policy is enforced to obtain at least one metric;

scoring the at least one network policy using the at least one metric and the operation goals to identify a highest rated network policy;

deploying the highest rated network policy and the service to the edge infrastructure to obtain updated edge infrastructure; and providing the service using the updated edge infrastructure.

2. The method of claim 1, wherein the at least one metric quantifies an impact of the at least one network policy on operation of the digital twin, the digital twin simulating operation of the deployment while that least one network policy is not enforced, and the digital twin predicting operation of the deployment under the at least one network policy while the at least one network policy is enforced in the digital twin.

3. The method of claim 1, further comprising:

adding, to the digital twin, a first simulation component corresponding to the service;

adding, to the digital twin, a second simulation component corresponding to at portion of the at least one network policy; and operating the digital twin with the first simulation component and the second simulation component.

4. The method of claim 3, wherein prior to addition of the first simulation component and the second simulation component, the digital twin simulates operation of the edge infrastructure.

5. The method of claim 1, wherein the operation goals further specifying a performance standard for the edge infrastructure, the performance standard discriminating acceptable levels of performance of the service by the edge infrastructure from unacceptable levels of performance of the service by the edge infrastructure.

6. The method of claim 1, wherein the network dependencies specify other services hosted by the edge infrastructure on which operation of the service depends.

7. The method of claim 6, wherein the network dependencies further specify protocols implemented by the edge infrastructure on which the operation of the service depends.

8. The method of claim 7, wherein the network dependencies further specify ports of endpoint devices of the edge infrastructure on which the operation of the service depends.

9. A non-transitory machine-readable medium having instructions stored therein, which when executed by a processor, cause the processor to perform operations for managing operation of endpoint devices of edge infrastructure, the operations comprising:

obtaining source code for a service for deployment to the edge infrastructure;

identifying, based on the source code, network dependencies for the service;

generating, based on the network dependencies and operation goals for the edge infrastructure, at least one network policy to facilitate operation of the service in the edge infrastructure, wherein the operation goals specify a security standard for the edge infrastructure, and the network policy defines a limit on network communications between the endpoint devices of the edge infrastructure to discriminate acceptable security risks from unacceptable security risks;

monitoring operating of a digital twin of the edge infrastructure while the at least one network policy is enforced to obtain at least one metric;

scoring the at least one network policy using the at least one metric and the operation goals to identify a highest rated network policy;

deploying the highest rated network policy and the service to the edge infrastructure to obtain updated edge infrastructure; and providing the service using the updated edge infrastructure.

10. The non-transitory machine-readable medium of claim 9, wherein the at least one metric quantifies an impact of the at least one network policy on operation of the digital twin, the digital twin simulating operation of the deployment while that least one network policy is not enforced, and the digital twin predicting operation of the deployment under the at least one network policy while the at least one network policy is enforced in the digital twin.

11. The non-transitory machine-readable medium of claim 9, wherein the operations further comprise:

adding, to the digital twin, a first simulation component corresponding to the service;

adding, to the digital twin, a second simulation component corresponding to at portion of the at least one network policy; and operating the digital twin with the first simulation component and the second simulation component.

12. The non-transitory machine-readable medium of claim 11, wherein prior to addition of the first simulation component and the second simulation component, the digital twin simulates operation of the edge infrastructure.

13. The non-transitory machine-readable medium of claim 9, wherein the operation goals further specifying a performance standard for the edge infrastructure, the performance standard discriminating acceptable levels of performance of the service by the edge infrastructure from unacceptable levels of performance of the service by the edge infrastructure.

14. The non-transitory machine-readable medium of claim 9, wherein the network dependencies specify other services hosted by the edge infrastructure on which operation of the service depends.

15. The non-transitory machine-readable medium of claim 14, wherein the network dependencies further specify protocols implemented by the edge infrastructure on which the operation of the service depends.

16. The non-transitory machine-readable medium of claim 15, wherein the network dependencies further specify ports of endpoint devices of the edge infrastructure on which the operation of the service depends.

17. A management system, comprising:

a processor; and a memory coupled to the processor to store instructions, which when executed by the processor, cause the processor to perform operations for managing operation of endpoint devices of edge infrastructure, the operations comprising:

obtaining source code for a service for deployment to the edge infrastructure;

identifying, based on the source code, network dependencies for the service;

generating, based on the network dependencies and operation goals for the edge infrastructure, at least one network policy to facilitate operation of the service in the edge infrastructure, wherein the operation goals specify a security standard for the edge infrastructure, and the network policy defines a limit on network communications between the endpoint devices of the edge infrastructure to discriminate acceptable security risks from unacceptable security risks;

monitoring operating of a digital twin of the edge infrastructure while the at least one network policy is enforced to obtain at least one metric;

scoring the at least one network policy using the at least one metric and the operation goals to identify a highest rated network policy;

deploying the highest rated network policy and the service to the edge infrastructure to obtain updated edge infrastructure; and providing the service using the updated edge infrastructure.

18. The management system of claim 17, wherein the at least one metric quantifies an impact of the at least one network policy on operation of the digital twin, the digital twin simulating operation of the deployment while that least one network policy is not enforced, and the digital twin predicting operation of the deployment under the at least one network policy while the at least one network policy is enforced in the digital twin.

19. The method of claim 1, wherein the limit on the network communications comprises closing one or more specific ports from network traffic.

20. The method of claim 1, wherein the scoring of the at least one network policy using the at least one metric and the operation goals comprises a weighted sum of factors, at least one factor corresponding to the security standard that defines the limit on the network communications.

* * * * *